(12) United States Patent
Oku

(10) Patent No.: US 10,171,051 B2
(45) Date of Patent: Jan. 1, 2019

(54) AMPLIFICATION CIRCUIT, OPTICAL MODULE, AND AMPLIFICATION METHOD

(71) Applicant: FUJITSU LIMITED, Kawasaki-shi, Kanagawa (JP)

(72) Inventor: Hideki Oku, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/366,399

(22) Filed: Dec. 1, 2016

(65) Prior Publication Data

US 2017/0187341 A1  Jun. 29, 2017

(30) Foreign Application Priority Data

Dec. 25, 2015 (JP) ................. 2015-255425

(51) Int. Cl.
- *H03F 3/45* (2006.01)
- *H04B 10/50* (2013.01)
- *H04B 10/61* (2013.01)
- *H04B 10/40* (2013.01)

(52) U.S. Cl.
CPC ........... *H03F 3/4508* (2013.01); *H04B 10/40* (2013.01); *H04B 10/502* (2013.01); *H04B 10/61* (2013.01); *H03F 2200/165* (2013.01); *H03F 2200/171* (2013.01); *H03F 2203/45116* (2013.01); *H03F 2203/45288* (2013.01)

(58) Field of Classification Search
CPC ... H04B 10/61; H04B 10/40; H03F 2200/165; H03F 2200/171
USPC .................................................. 398/135, 136
See application file for complete search history.

(56) References Cited

U.S. PATENT DOCUMENTS

| | | | | |
|---|---|---|---|---|
| 4,943,956 A | * | 7/1990 | Noro | ...................... H04R 3/002 333/217 |
| 5,392,001 A | * | 2/1995 | Uhling | ............... G01R 1/06766 324/123 C |
| 5,548,570 A | * | 8/1996 | Hirajima | .......... G11B 20/10212 369/124.13 |
| 9,621,279 B2 | * | 4/2017 | Okamoto | ............. H04B 10/697 |
| 2005/0025259 A1 | * | 2/2005 | Miyasita | ................. H03K 5/003 371/319 |
| 2005/0286575 A1 | * | 12/2005 | Hattori | ................ H01S 5/06213 372/29.02 |

(Continued)

FOREIGN PATENT DOCUMENTS

| | | |
|---|---|---|
| JP | 5-327370 | 12/1993 |
| JP | 8-46444 | 2/1996 |
| JP | 2008-182529 | 8/2008 |

*Primary Examiner* — Oommen Jacob
(74) *Attorney, Agent, or Firm* — Fujitsu Patent Center

(57) ABSTRACT

An amplification circuit coupled to another circuit by alternating current (AC) coupling includes: an amplifier that amplifies and outputs a signal input from the other circuit or amplifies an input signal and outputs the amplified input signal to the other circuit; a feedback circuit that positively feeds back the signal output from the amplifier to an input of the amplifier; and a low pass filter that attenuates a high frequency component of the signal positively fed back to the input of the amplifier by the feedback circuit, and in which a higher cut-off frequency is set such that a lower cut-off frequency in a combination of the amplification circuit and a high pass filter formed by the AC coupling is lower than a lower cut-off frequency in the high pass filter.

8 Claims, 17 Drawing Sheets

(56) References Cited

U.S. PATENT DOCUMENTS

| | | | |
|---|---|---|---|
| 2006/0125543 A1* | 6/2006 | Hsieh | H03F 3/45973 327/307 |
| 2008/0106330 A1* | 5/2008 | Yoshida | H03F 3/387 330/10 |
| 2008/0129563 A1* | 6/2008 | Boomer | H03M 1/1023 341/120 |
| 2008/0179496 A1 | 7/2008 | Sakura et al. | |
| 2012/0141122 A1* | 6/2012 | Carusone | H04B 10/6971 398/37 |
| 2013/0281039 A1* | 10/2013 | Cathelin | H04B 1/0053 455/234.1 |
| 2016/0056900 A1* | 2/2016 | Okamoto | H04B 10/697 398/38 |
| 2017/0187341 A1* | 6/2017 | Oku | H03F 3/4508 |

* cited by examiner ly of the prior Japanese Patent Application No. 2015-255425, filed on Dec. 25, 2015, the entire contents of which are incorporated herein by reference.

AMPLIFICATION CIRCUIT, OPTICAL MODULE, AND AMPLIFICATION METHOD

CROSS-REFERENCE TO RELATED APPLICATION

This application is based upon and claims the benefit of priority of the prior Japanese Patent Application No. 2015-255425, filed on Dec. 25, 2015, the entire contents of which are incorporated herein by reference.

FIELD

The embodiments disclosed herein are related to an amplification circuit, an optical module, and an amplification method.

BACKGROUND

An amplification circuit that amplifies an electrical signal have heretofore been used in a light receiving circuit and the like. For example, a feedback circuit is known that feeds back output voltage of an inversion amplifier to the input terminal, a light receiving element being coupled to the input terminal.

However, in the above-described technology in the prior art, in a configuration in which alternating current (AC) coupling is used between the amplification circuit and another circuit, a high pass filter is formed by AC coupling, causing a problem of occurrence of a lower cut-off frequency.

When a lower cut-off frequency occurs, a sag occurs due to attenuation of a low frequency component of a signal. In addition, when a capacitance of a capacitor of AC coupling is increased in order to raise the lower cut-off frequency, the size of the device increases.

The following is a reference document.
[Document 1] Japanese Laid-open Patent Publication No. 2008-182529.

SUMMARY

According to an aspect of the invention, an amplification circuit coupled to another circuit by alternating current (AC) coupling includes: an amplifier that amplifies and outputs a signal input from the other circuit or amplifies an input signal and outputs the amplified input signal to the other circuit; a feedback circuit that positively feeds back the signal output from the amplifier to an input of the amplifier; and a low pass filter that attenuates a high frequency component of the signal positively fed back to the input of the amplifier by the feedback circuit, and in which a higher cut-off frequency is set such that a lower cut-off frequency in a combination of the amplification circuit and a high pass filter formed by the AC coupling is lower than a lower cut-off frequency in the high pass filter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A detailed explanation follows regarding embodiments of an amplification circuit, an optical module, and an amplification method of the technology disclosed herein with reference to the drawings.

Embodiments (Amplification Circuit According to an Embodiment)

Figure 1:
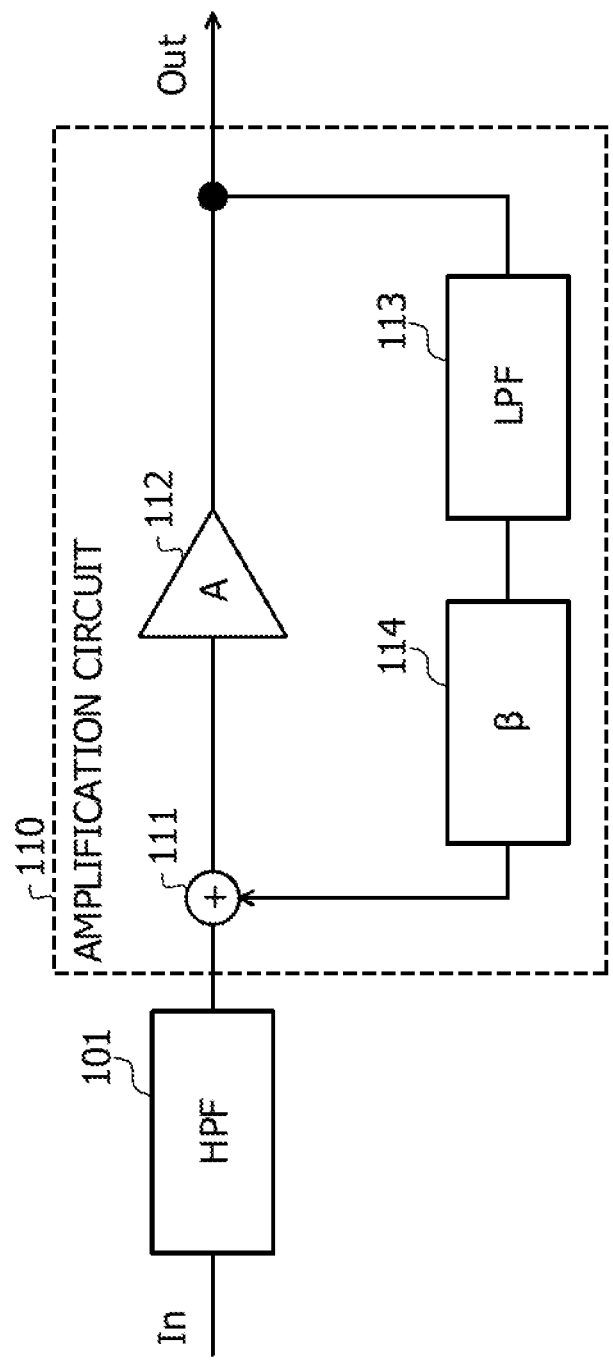
FIG. 1 is a diagram illustrating an example of an amplification circuit according to an embodiment.

FIG. 1 is a diagram illustrating an example of an amplification circuit according to an embodiment. An amplification circuit 110 according to the embodiment is coupled to a circuit at the previous stage of the amplification circuit 110 using AC coupling. For example, a capacitor is placed between the circuit at the previous stage of the amplification circuit 110 and the amplification circuit 110 in series. Therefore, as illustrated in FIG. 1, a high pass filter (HPF) 101 using AC coupling is formed at an input of the amplification circuit 110. The amplification circuit 110 includes a synthesis unit 111, an amplifier 112 (A), a low pass filter (LPF) 113, and a feedback circuit 114 (β).

A signal (In) output from the previous stage circuit of the amplification circuit 110 is input to the synthesis unit 111 through the HPF 101. The synthesis unit 111 combines the signal input through the HPF 101 with a signal output from the feedback circuit 114 so as to be in the same phase. Then, the synthesis unit 111 outputs the combined signal to the amplifier 112.

The amplifier 112 amplifies the signal output from the synthesis unit 111 by gain A. The gain A is, for example, gain larger than 1 (A>1). The amplifier 112 outputs the amplified signal. The signal (Out) output from the amplifier 112 is output to the following stage of the amplification circuit 110 and is also input to the LPF 113.

The LPF 113 extracts only a specified low frequency component from the signal output from the amplifier 112. Namely, the LPF 113 attenuates only a specified high frequency component out of the signal output from the amplifier 112. The LPF 113 then outputs the extracted low frequency component signal to the feedback circuit 114.

Figure 6:
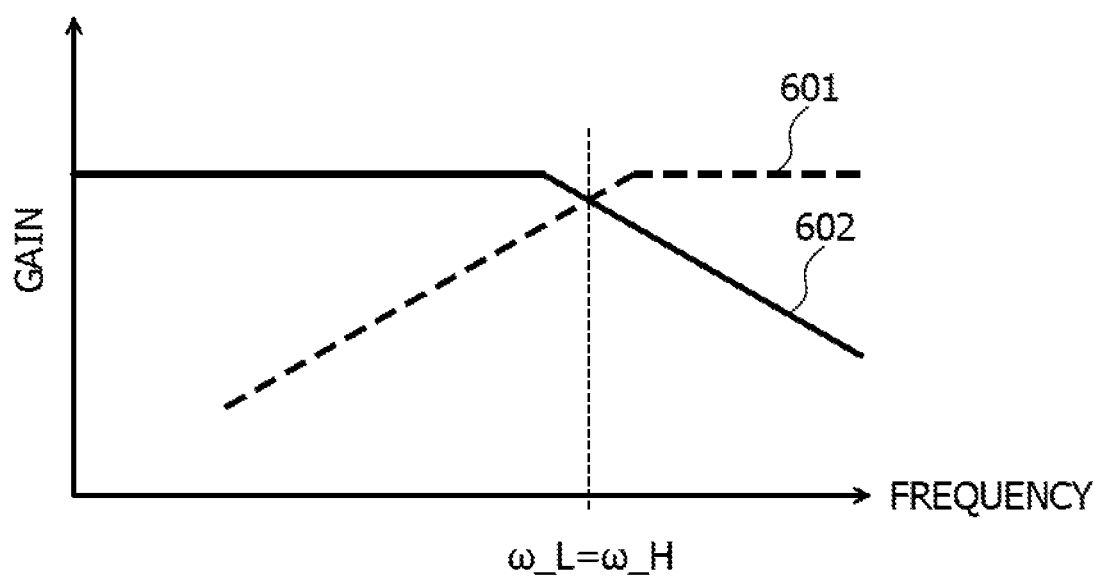
FIG. 6 is a graph illustrating an example of cut-off frequencies of a high pass filter (HPF) and a low pass filter (LPF) according to the embodiment.

For example, the LPF 113 has frequency characteristics in which an upper cut-off frequency (high frequency side) is substantially the same as (equivalent to) a lower cut-off frequency (low frequency side) of the HPF 101 (for example, see FIG. 6). The high-frequency cut-off frequency (upper cut-off frequency) of the LPF 113 is the lower limit of a frequency range in which the output signal from the LPF 113 is attenuated by 3 dB or greater compared with the signal input to the LPF 113. The low-frequency cut-off frequency (lower cut-off frequency) of the HPF 101 is the upper limit of a frequency range in which the output signal from the HPF 101 is attenuated by 3 dB or greater compared with the signal input to the HPF 101.

The feedback circuit 114 attenuates the signal output from the LPF 113 by a feedback factor (gain) β. The feedback factor β is, for example, a feedback factor of less than 1 (β<1). The feedback circuit 114 outputs the attenuated signal to the synthesis unit 111. Through the feedback circuit 114, positive feedback may be applied between the input and the output of the amplifier 112. This enables the lower cut-off frequency in the amplification circuit 110 to be lowered.

A product A·β of the gain A of the amplifier 112 and the feedback factor β of the feedback circuit 114 represents a loop gain of the signal in the positive feedback. The gain A of the amplifier 112 and the feedback factor β of the feedback circuit 114 are designed so as to satisfy 0<A·β<1. This keeps the loop gain (A·β) of the signal under 1, thereby enabling the oscillation due to a positive feedback to be suppressed. A feedback circuit in which the output from the amplifier 112 is positively fed back to the input of the amplifier 112 may be implemented by the feedback circuit 114 and the synthesis unit 111, such that the loop gain of the signal is less than 1.

As described above, the amplification circuit 110 is configured such that a high frequency component of a signal positively fed back to the input of the amplifier 112 by the feedback circuit 114 and the synthesis unit 111 is attenuated by providing the LPF 113. This enables the lower cut-off frequency in a combination of the HPF 101 and the amplification circuit 110 formed by AC coupling to be made lower than the lower cut-off frequency of the HPF 101. Therefore, the lower cut-off frequency may be lowered even without increasing the capacitance of a capacitor of AC coupling. This thereby enables an occurrence of a sag due to the low frequency component of the signal being attenuated by AC coupling to be suppressed, while suppressing an increase in the size of the device.

In addition, the oscillation due to the positive feedback by the feedback circuit 114 and the synthesis unit 111 may be suppressed by setting the loop gain (closed loop gain) from the positive feedback by the feedback circuit 114 and the synthesis unit 111 to less than 1. This thereby enables an operation of the amplification circuit 110 to be stabilized.

(Transfer Function in the Amplification Circuit According to the Embodiment)

An explanation follows regarding transfer function of the amplification circuit 110 according to the embodiment. A transfer function H_H (s) of the HPF 101 coupled to the amplification circuit 110 may be expressed, for example, by the following equation (1). Here, ω_H is a lower cut-off angular frequency of the HPF 101.

$$H\_H(s) = \frac{s}{s + \omega\_H} \quad (1)$$

A transfer function H_L (s) of the LPF 113 may be expressed, for example, by the following equation (2). Here, ω_L is a higher cut-off angular frequency in the LPF 113.

$$H\_L(s) = \frac{\omega\_L}{s + \omega\_L} \quad (2)$$

A transfer function H_Prop (s) of the amplification circuit 110 may be expressed, for example, by the following equation (3). Here, "A" is gain A in the amplifier 112. In addition, "β" is a feedback factor (gain) β in the feedback circuit 114.

$$H\_Prop(s) = \frac{A(s + \omega\_L)}{s - (1 - \beta A)\omega\_L} \quad (3)$$

Let the transfer function of a combination of the HPF 101 and the amplification circuit 110 be H_All (s). The transfer function H_All (s) is a product of the transfer function H_H (s) of the HPF 101 and the transfer function H_Prop (s) of the amplification circuit 110. Thus, the transfer function H_All (s) may be expressed, for example, by the following equation (4) based on the above-described equations (1) to (3).

$$H\_All(s) = H\_H(s) \cdot H\_Prop(s) = \frac{s}{s + \omega\_H} \cdot \frac{A(s + \omega\_L)}{s - (1 - \beta A)\omega\_L} \quad (4)$$

Thus, when the higher cut-off angular frequency ω_L in the LPF 113 and the lower cut-off angular frequency ω_H in the HPF 101 are identically assumed to be (ω_L=ω_H), the transfer function H_All (s) may be expressed, for example, by the following equation (5).

$$H\_All(s) \mid (\omega\_L = \omega\_H) = \quad (5)$$
$$\frac{s}{s + \omega\_H} \cdot \frac{A(s + \omega\_H)}{s - (1 - \beta A)\omega\_H} = \frac{A\_s}{s - (1 - \beta A)\omega\_H}$$

To facilitate qualitative understanding, assume that A·β=1, then the transfer function H_All (s) adopts H_All (s)=A based on the above-described equation (5). Namely, flat frequency characteristics are obtained. However, as described above, the amplification circuit 110 is designed to meet A·β<1 such that an oscillation condition is not satisfied. Thus, the oscillation may be suppressed while obtaining flat frequency characteristics by designing the amplification circuit 110 such that A·β approaches to 1 (for example, A·β=0.9) in a range in which A·β<1 is met.

(Change in Frequency Characteristics by a Product A·β in the Amplification Circuit According to the Embodiment)

FIGS. 2 to 5 are diagrams each illustrating an example of a change in frequency characteristics by a product A·β in the amplification circuit according to the embodiment. FIGS. 2 to 5 each illustrates a complex plane in which the horizontal axis indicates a real axis (Re), and the vertical axis indicates an imaginary axis (Im). FIGS. 2 to 5 respectively illustrate frequency characteristics of combinations of the HPF 101 and the amplification circuit 110 by poles 211 and 212 (x) and zero points 221 and 222 (○) in which A·β=1, A·β=0.9, A·β=0.8, and A·β=0.7, respectively.

Figure 2:
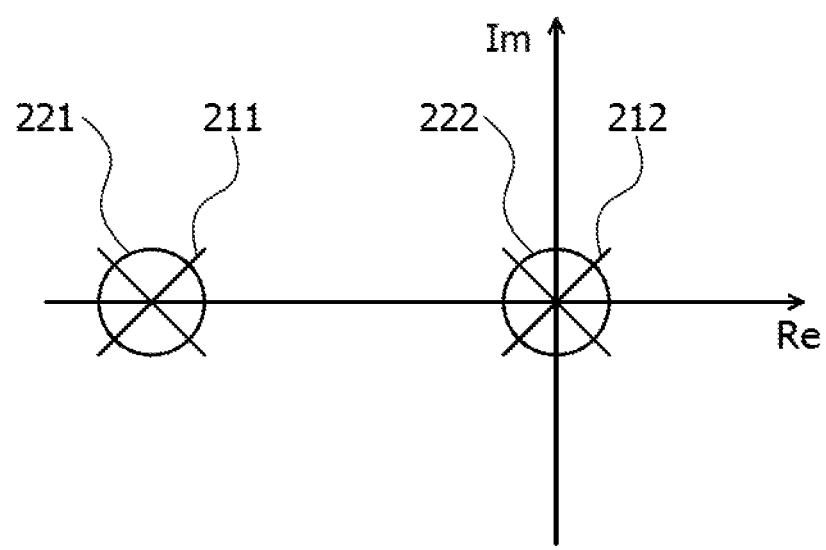
FIG. 2 is a diagram illustrating a first example of a change in frequency characteristics by a product $A \cdot \beta$ in the amplification circuit according to the embodiment.
Figure 3:
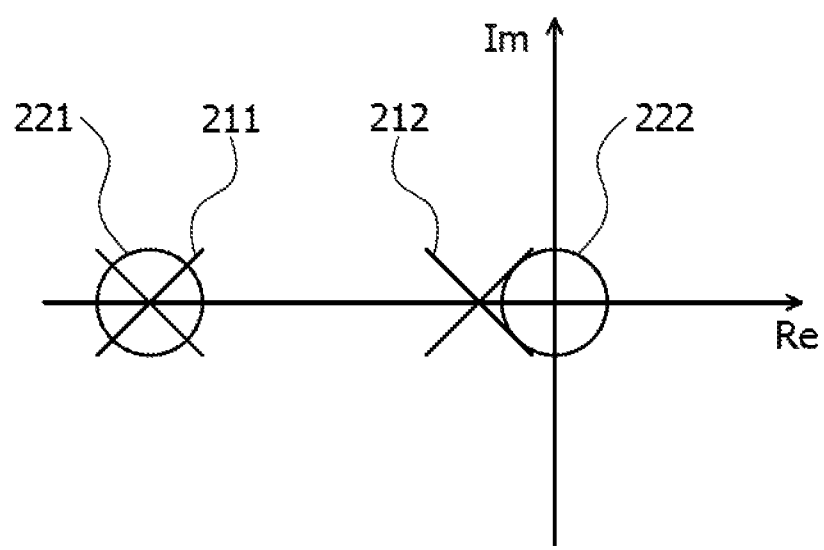
FIG. 3 is a diagram illustrating a second example of a change in frequency characteristics by a product $A \cdot \beta$ in the amplification circuit according to the embodiment.
Figure 4:
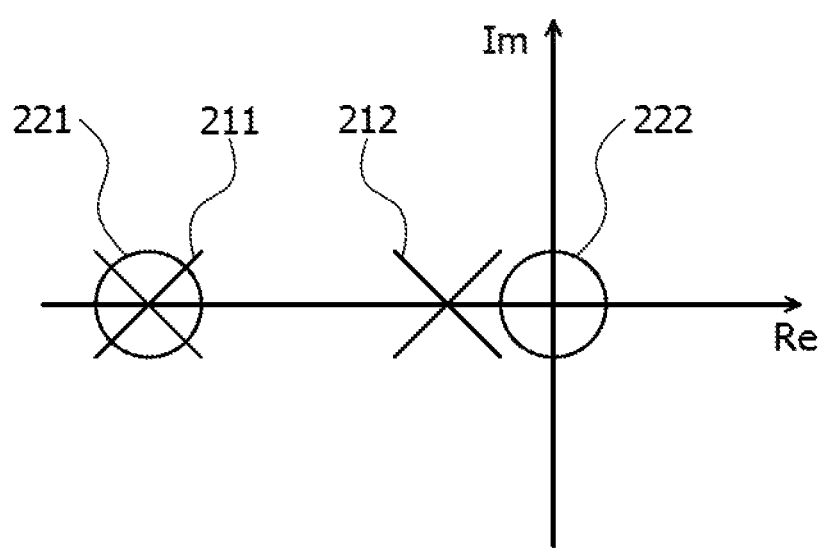
FIG. 4 is a diagram illustrating a third example of a change in frequency characteristics by a product $A \cdot \beta$ in the amplification circuit according to the embodiment.
Figure 5:
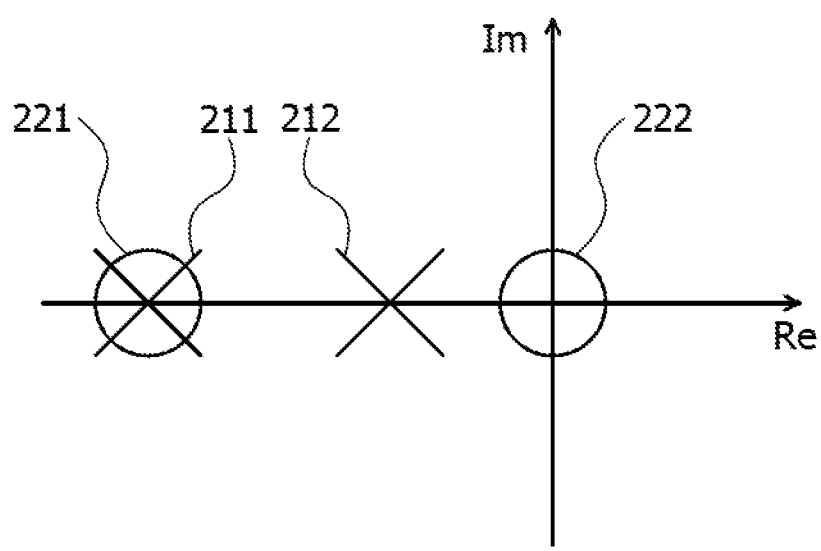
FIG. 5 is a diagram illustrating a fourth example of a change in frequency characteristics by a product $A \cdot \beta$ in the amplification circuit according to the embodiment.

For example, as illustrated in FIG. 2, when A·β=1, the pole 211 and the zero point 221 overlap on the real axis and are cancelled with each other, and the pole 212 and the zero point 222 overlap on the real axis and are cancelled with each other. Therefore, the combination of the HPF 101 and the amplification circuit 110 have flat frequency characteristics. In addition, as illustrated in FIGS. 3 to 5, the smaller is A·β than 1, the further the pole 212 moves to the negative direction on the real axis, making the gap between the pole 212 and the zero point 222 wider. Therefore, the smaller A·β is, the less flat the frequency characteristics of the combination of the HPF 101 and the amplification circuit 110 become.

(Cut-Off Frequencies of the HPF and the LPF in the Embodiment)

FIG. 6 is a graph illustrating an example of cut-off frequencies of the HPF and the LPF according to the embodiment. In FIG. 6, the horizontal axis indicates a frequency, and the vertical axis indicates gain. Frequency characteristics 601 indicates characteristics of gain for frequencies in the HPF 101. Frequency characteristics 602 indicates characteristics of gain for frequencies in the LPF 113.

The lower cut-off angular frequency ω_H of the HPF 101 is, for example, a frequency of the upper limit in a frequency range in which the gain in the frequency characteristics 601 is −3 dB or less. The higher cut-off angular frequency ω_L of the LPF 113 is a frequency of the lower limit in a frequency range in which the gain in the frequency characteristics 602 is −3 dB or less. In the example illustrated in FIG. 6, ω_H=ω_L.

(Frequency Characteristics in the Amplification Circuit According to the Embodiment)

Figure 7:
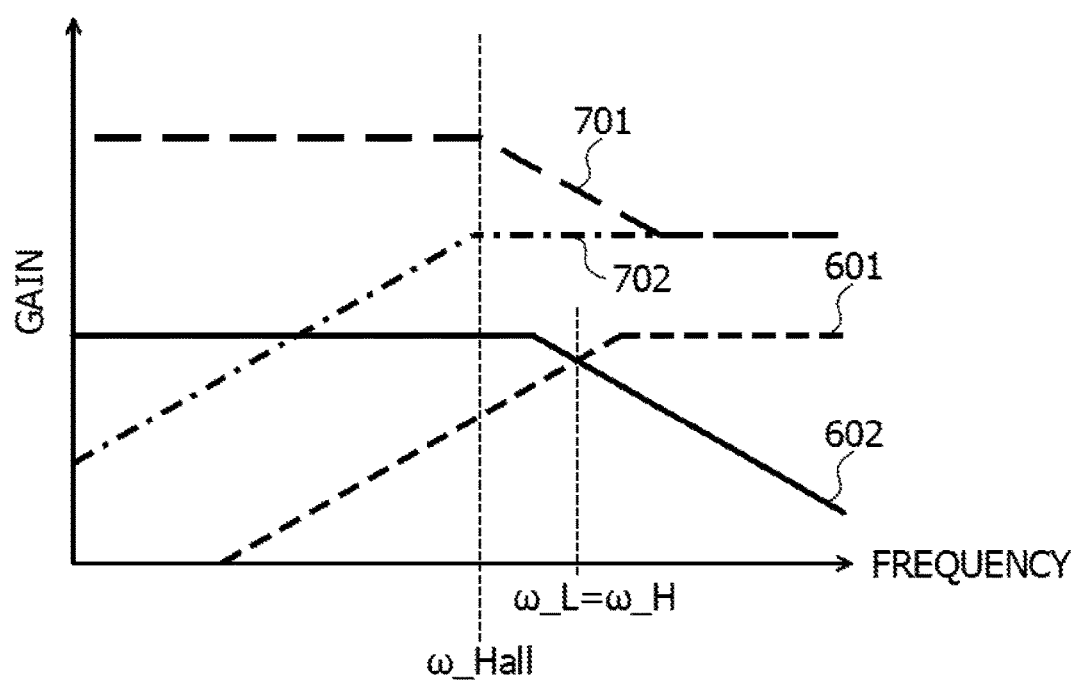
FIG. 7 is a graph illustrating an example of frequency characteristics in the amplification circuit according to the embodiment.

FIG. 7 is a graph illustrating an example of frequency characteristics in the amplification circuit according to the embodiment. In FIG. 7, a portion similar to the portion illustrated in FIG. 6 is assigned the same symbol, and the description thereof is omitted. Frequency characteristics 701 indicates characteristics of gain for frequencies in the amplification circuit 110. Frequency characteristics 702 indicates characteristics of gain for frequencies in a configuration in which the HPF 101 and the amplification circuit 110 are combined.

The frequency characteristics 701 of the amplification circuit 110 have characteristics inverse to the frequency characteristics 601 of the HPF 101 in the slope portion. In addition, when a lower cut-off angular frequency of the frequency characteristics 702 of the configuration in which the HPF 101 and the amplification circuit 110 are combined is referred to as ω_Hall, the cut-off angular frequency ω_Hall is lower than the lower cut-off angular frequency ω_H of the frequency characteristics 601 of the HPF 101. Namely, the bandwidth of the amplification circuit 110 may be widened to the low frequency side.

(Trans-Impedance Amplifier (TIA) Device to which the Amplification Circuit According to the Embodiment has been Applied)

Figure 8:
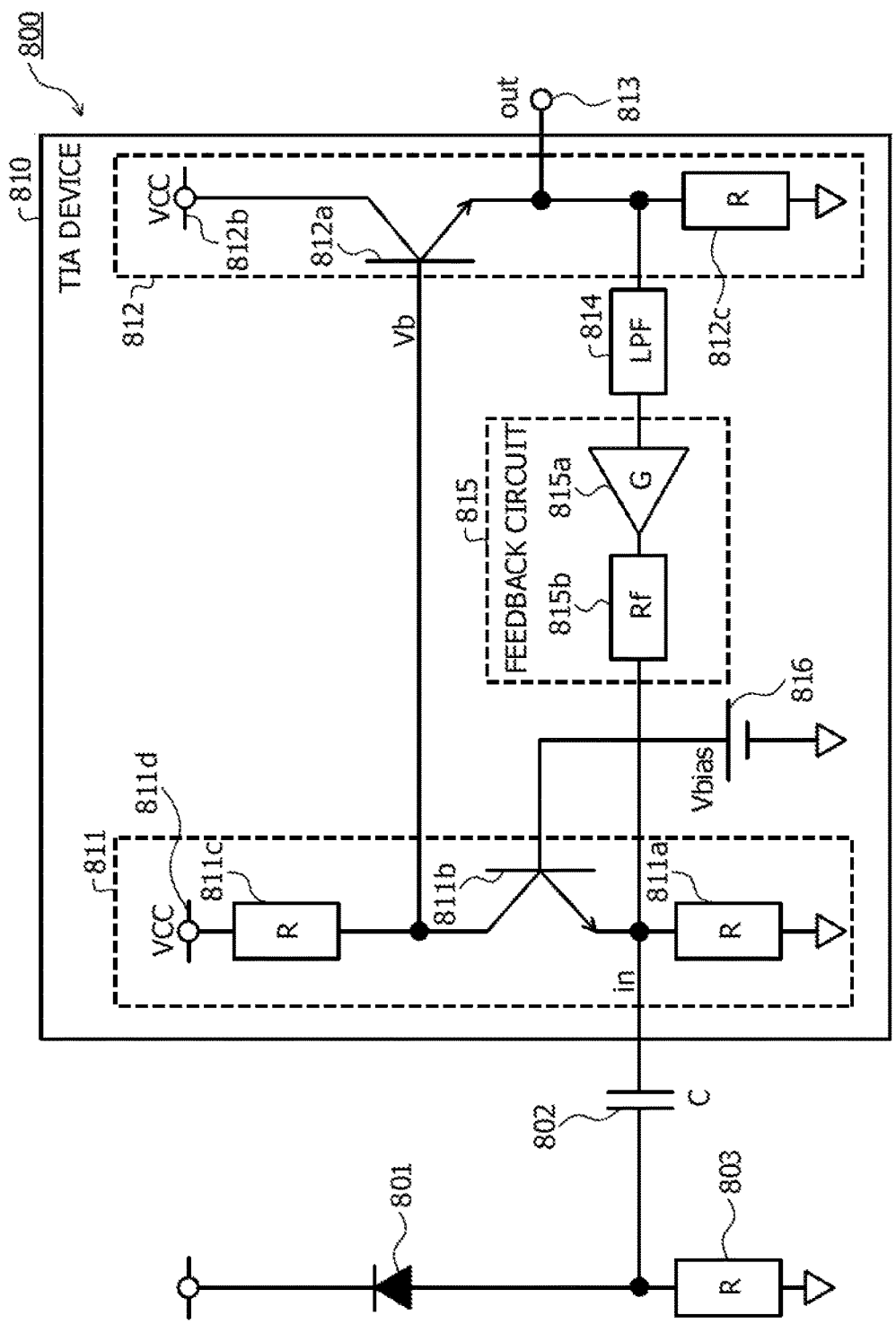
FIG. 8 is a diagram illustrating an example of a trans-impedance amplifier (TIA) device to which the amplification circuit according to the embodiment has been applied.

FIG. 8 is a diagram illustrating an example of a TIA device to which the amplification circuit according to the embodiment has been applied. An optical module 800 illustrated in FIG. 8 is an optical module that includes a photodiode 801, a capacitor 802, a resistor 803, and a TIA device 810. The amplification circuit 110 according to the embodiment may be applied, for example, to the TIA device 810 illustrated in FIG. 8.

The photodiode 801 is a light receiving element that outputs an electrical signal that corresponds to power of the received light. The TIA device 810 converts the current signal output from the photodiode 801 into a voltage signal. For example, the TIA device 810 is coupled to the anode of the photodiode 801 through the capacitor 802 (C). The photodiode 801 and the TIA device 810 are coupled through the capacitor 802 employing AC coupling. One end of the resistor 803 (R) is connected to between the anode of the photodiode 801 and the capacitor 802, and the other end is grounded.

The TIA device 810 includes a grounded-base type TIA 811, an emitter follower 812, an output terminal 813 (out), an LPF 814, a feedback circuit 815, and a bias unit 816 (Vbias).

The grounded-base type TIA 811 is a grounded-base transimpedance amplifier, and is a component corresponding to the amplifier 112 illustrated in FIG. 1. For example, the grounded-base type TIA 811 includes a resistor 811a (R), a bipolar transistor 811b, a resistor 811c (R), and a voltage source 811d (VCC).

One end of the resistor 811a is connected to between the capacitor 802 and the bipolar transistor 811b, and the other end is grounded. The emitter of the bipolar transistor 811b is coupled to the capacitor 802, the base thereof is coupled to the bias unit 816, and the collector thereof is coupled to the resistor 811c and the emitter follower 812.

One end of the resistor 811c is coupled to the collector of the bipolar transistor 811b and the emitter follower 812, and the other end is coupled to the voltage source 811d. The current signal output from the photodiode 801 is converted into a voltage signal Vb and output to the emitter follower 812, as a result. A gain in the grounded-base type TIA 811 corresponds to the gain A of the amplifier 112 illustrated in FIG. 1.

The emitter follower 812 includes a bipolar transistor 812a, a voltage source 812b (VCC), and a resistor 812c (R). The base of the bipolar transistor 812a is coupled to the grounded-base type TIA 811, the collector thereof is coupled to the voltage source 812b, and the emitter thereof is coupled to the LPF 814 and the output terminal 813. One end of the resistor 812c is connected to between the emitter of the bipolar transistor 812a and the LPF 814, and the other end is grounded.

The output terminal 813 is connected to between the emitter of the bipolar transistor 812a in the emitter follower 812 and the LPF 814. The signal (voltage signal) indicating optical power detected by the photodiode 801 may be output from the output terminal 813, as a result.

The LPF 814 is a component corresponding to the LPF 113 illustrated in FIG. 1. In addition, the LPF 814 extracts only a specified low frequency component out of the signal (voltage signal) output from the emitter follower 812, and outputs the extracted low frequency component signal to the feedback circuit 815.

The feedback circuit 815 includes a gain unit 815a (G) and a feedback resistor 815b (Rf). The gain unit 815a provides a specified gain to the signal output from the LPF 814 and outputs the signal provided with the gain to the feedback resistor 815b. The feedback resistor 815b converts the voltage signal output from the gain unit 815a into a current signal. The feedback resistor 815b then positively feeds back the signal converted into the current signal, into the emitter of the bipolar transistor 811b in the grounded-base type TIA 811. The feedback factor (gain) in the feedback circuit 815 corresponds to the feedback factor (gain) β of the feedback circuit 114 illustrated in FIG. 1.

One end of the bias unit 816 is coupled to the base of the bipolar transistor 811b, and the other end is grounded.

The TIA device 810 illustrated in FIG. 8 is designed such that a product A·β of the gain A in the grounded-base type TIA 811 and the feedback factor β of the feedback circuit 815 is in the state "0<A·β<1". This enables the oscillation in the positive feedback to be suppressed.

In addition, the higher cut-off frequency of the LPF 814 is a frequency that is equivalent to (for example, the same as) the lower cut-off frequency of a HPF formed by the capacitor 802. As a result, a lower cut-off frequency in the combination of the capacitor 802 and the TIA device 810 may be lowered even without increasing the capacitance of the capacitor 802. Therefore, for example, a sag in the signal output from the output terminal 813 may be suppressed.

As illustrated in FIG. 8, the amplifier 112 illustrated in FIG. 1 may be applied, for example, to a grounded base transistor amplification circuit in which the base of the transistor is grounded (for example, the grounded-base type TIA 811). In addition, to such a transistor amplification circuit (for example, the grounded-base type TIA 811), the emitter follower 812 that outputs a signal amplified by the transistor amplification circuit may be coupled.

In addition, the feedback circuit 114 illustrated in FIG. 1 may be configured including an amplification unit that amplifies a signal output from the amplifier 112 (for example, the gain unit 815a) and a resistor through which the signal output from the amplifier 112 is passed (the feedback resistor 815b).

(Differential Trans-Impedance Amplifier to which the Amplification Circuit According to the Embodiment has been Applied)

Figure 9:
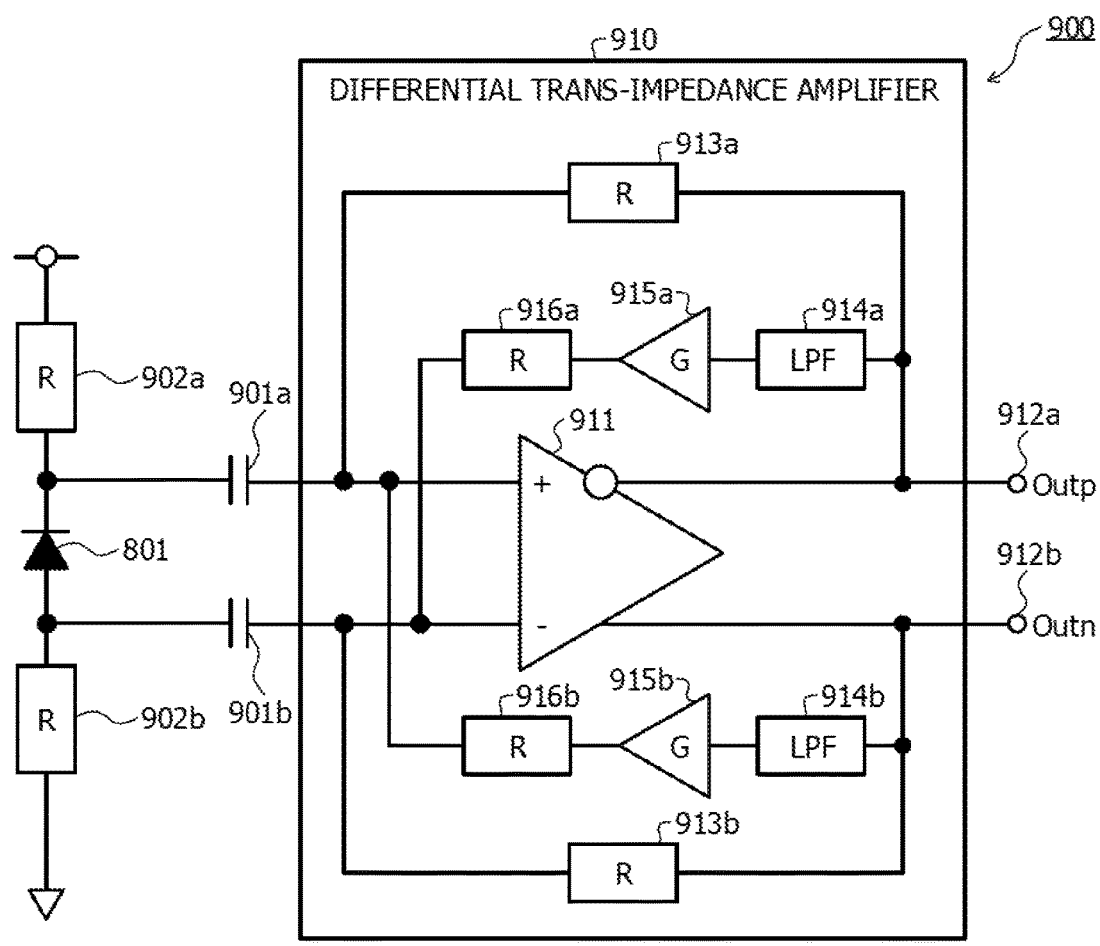
FIG. 9 is a diagram illustrating an example of a differential trans-impedance amplifier to which the amplification circuit according to the embodiment has been applied.

FIG. 9 is a diagram illustrating an example of a differential trans-impedance amplifier to which the amplification circuit according to the embodiment has been applied. In FIG. 9, a portion similar to the portion illustrated in FIG. 8 is assigned the same symbol, and the description thereof is omitted. An optical module 900 illustrated in FIG. 9 is an optical module including the photodiode 801, capacitors 901a and 901b, resistors 902a and 902b (R), and a differential trans-impedance amplifier 910.

The amplification circuit 110 according to the embodiment may be applied, for example, to the differential trans-impedance amplifier 910 illustrated in FIG. 9. In the example illustrated in FIG. 9, the differential trans-impedance amplifier 910 converts differential current signals output from the photodiode 801 into voltage signals. For example, the differential trans-impedance amplifier 910 is coupled to the cathode of the photodiode 801 through the capacitor 901a, and is coupled to the anode of the photodiode 801 through the capacitor 901b.

One end of the resistor 902a is connected to between the cathode of the photodiode 801 and the capacitor 901a, and the other end is grounded. One end of the resistor 902b is connected to between the anode of the photodiode 801 and the capacitor 901b, and the other end is grounded. The photodiode 801 and the differential trans-impedance amplifier 910 are coupled through the capacitors 901a and 901b employing AC coupling.

The differential trans-impedance amplifier 910 includes a differential amplifier 911, output terminals 912a and 912b, resistors 913a and 913b, LPFs 914a and 914b, gain units 915a and 915b, and resistors 916a and 916b.

The differential amplifier 911 includes a positive input terminal (+) and a negative input terminal (−), and is a component corresponding to the amplifier 112 illustrated in FIG. 1. The positive input terminal (+) of the differential amplifier 911 is coupled to the cathode of the photodiode 801 through the capacitor 901a. The negative input terminal (−) of the differential amplifier 911 is coupled to the anode of the photodiode 801 through the capacitor 901b.

The differential amplifier 911 performs differential amplification of signals that have been input through the positive input terminal (+) and the negative input terminal (−), and outputs the normal signal and the inversion signal obtained by the differential amplification. The normal signal from the differential amplifier 911 is output from the output terminal 912a (Outp), and also input to the resistor 913a and the LPF 914a. The inversion signal from the differential amplifier 911 is output from the output terminal 912b (Outn), and also input to the resistor 913b and the LPF 914b. The gain in the differential amplifier 911 corresponds to the gain A of the amplifier 112 illustrated in FIG. 1.

The resistor 913a converts, from the voltage signal into a current signal, the normal signal output from the differential amplifier 911, and feeds back the converted normal signal to the positive input terminal (+) of the differential amplifier 911. The resistor 913b converts, from the voltage signal into a current signal, the inversion signal output from the differential amplifier 911, and feeds back the converted inversion signal to the negative input terminal (−) of the differential amplifier 911.

The LPFs 914a and 914b are components that correspond to the LPF 113 illustrated in FIG. 1. The LPF 914a extracts only a specified low frequency component out of the normal signal output from the differential amplifier 911, and outputs the normal signal of the extracted low frequency component to the gain unit 915a. The LPF 914b extracts only a specified low frequency component out of the inversion signal output from the differential amplifier 911, and outputs the inversion signal of the extracted low frequency component to the gain unit 915b.

The gain units 915a and 915b and the resistors 916a and 916b are components that correspond to the feedback circuit 114 illustrated in FIG. 1. The feedback factor (gain) of the gain units 915a and 915b and the resistors 916a and 916b corresponds to the feedback factor (gain) β of the feedback circuit 114 illustrated in FIG. 1.

The gain unit 915a provides a specified gain to the normal signal output from the LPF 914a and outputs the normal signal provided with the gain to the resistor 916a. The resistor 916a converts, from the voltage signal into a current signal, the normal signal output from the LPF 914a and feeds back the converted normal signal to the negative input terminal (−) of the differential amplifier 911.

The gain unit 915b provides a specified gain to the inversion signal output from the LPF 914b and outputs the inversion signal provided with the gain to the resistor 916b. The resistor 916b converts, from the voltage signal into a current signal, the inversion signal output from the LPF 914b and feeds back the converted inversion signal to the positive input terminal (+) of the differential amplifier 911.

The differential trans-impedance amplifier 910 illustrated in FIG. 9 is designed such that a product A·β of the gain A in the differential amplifier 911 and the feedback factor β of the gain units 915a and 915b and the resistors 916a and 916b is in the state "0<A·β<1". This enables the oscillation in the positive feedback to be suppressed.

In addition, the higher cut-off frequencies of the LPFs 914a and 914b are respectively a frequency that is equivalent to (for example, the same as) the lower cut-off frequency of the HPF formed by the capacitors 901a and 901b. As a result, the lower cut-off frequency in the combination of the capacitors 901a and 901b and the differential trans-impedance amplifier 910 may be lowered even without increasing the capacitances of the capacitors 901a and 901b. Therefore, for example, a sag in the signals output from the output terminals 912a and 912b may be suppressed.

As illustrated in FIG. 9, the amplification circuit 110 may be applied, for example, to the differential amplifier 911. In this case, the feedback circuit 114 may be configured including a first feedback circuit that positively feeds back the normal output of the differential amplifier 911 to the input of the differential amplifier 911, and a second feedback circuit that positively feeds back the inversion output of the differential amplifier 911 to the input of the differential amplifier 911. In this case, the first feedback circuit corresponds to, for example, the gain unit 915a and the resistor 916a illustrated in FIG. 9. In addition, the second feedback circuit corresponds to, for example, the gain unit 915b and the resistor 916b illustrated in FIG. 9.

(Optical Interconnect System to which the Amplification Circuit According to the Embodiment has been Applied)

Figure 10:
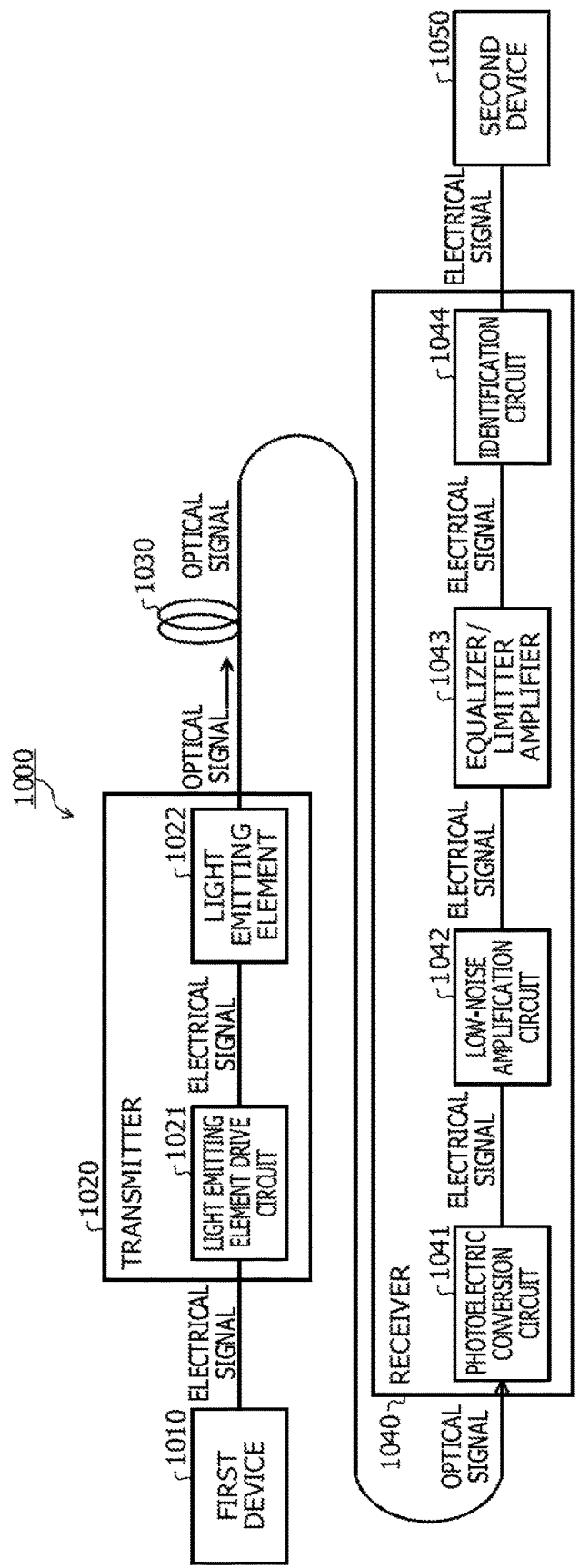
FIG. 10 is a diagram illustrating an example of an optical interconnect system to which the amplification circuit according to the embodiment has been applied.

FIG. 10 is a diagram illustrating an example of an optical interconnect system to which the amplification circuit according to the embodiment has been applied. The amplification circuit 110 according to the embodiment may be applied, for example, to an optical interconnect system 1000 illustrated in FIG. 10. The optical interconnect system 1000 is a system of optical interconnect, which performs optical communication for data transmission between a first device 1010 and a second device 1050. Each of the first device 1010 and the second device 1050 is, for example, a processor such as a central processing unit (CPU).

As illustrated in FIG. 10, the optical interconnect system 1000 includes the first device 1010, a transmitter 1020, an optical transmission path 1030, a receiver 1040, and the second device 1050. The first device 1010 generates an electrical signal indicating data to be transmitted to the second device 1050 and outputs the generated electrical signal to the transmitter 1020.

The transmitter 1020 is an optical module including a light emitting element drive circuit 1021 and a light emitting element 1022. The light emitting element drive circuit 1021 generates an electrical signal (drive signal) that drives the light emitting element 1022 by amplifying the electrical signal output from the first device 1010. The light emitting element drive circuit 1021 then outputs the generated electrical signal to the light emitting element 1022. The light emitting element 1022 oscillates light according to the electrical signal output from the light emitting element drive circuit 1021, and emits the oscillated light as an optical signal to the optical transmission path 1030. A laser diode (LD), for example, may be used as the light emitting element 1022.

The optical signal emitted from the transmitter 1020 is emitted by being propagated through the optical transmission path 1030 to the receiver 1040. A waveguide such as an optical fiber, for example, may be used as the optical transmission path 1030. In addition, the optical transmission path 1030 may be a space through which light is propagated.

The receiver 1040 is an optical module including a photoelectric conversion circuit 1041, a low-noise amplification circuit 1042, an equalizer/limiter amplifier 1043, and an identification circuit 1044. The photoelectric conversion circuit 1041 is a light receiving element that converts the optical signal emitted from the optical transmission path 1030 into an electrical signal, and outputs the converted electrical signal to the low-noise amplification circuit 1042. As the photoelectric conversion circuit 1041 a photodiode (PD), for example, may be used.

The low-noise amplification circuit 1042 amplifies the electrical signal output from the photoelectric conversion circuit 1041 with low noise, and outputs the amplified electrical signal to the equalizer/amplifier 1043. In addition, the coupling between the photoelectric conversion circuit 1041 and the low-noise amplification circuit 1042 is provided through a capacitor, namely, AC coupling.

The amplification circuit 110 according to the embodiment may be applied, for example, to the low-noise amplification circuit 1042. As a result, the lower cut-off frequency may be lowered even without increasing the capacitance of the capacitor of AC coupling between the photoelectric conversion circuit 1041 and the low-noise amplification circuit 1042. Therefore, for example, a sag in the signal output from the low-noise amplification circuit 1042 to the equalizer/amplifier 1043 may be suppressed.

The equalizer/amplifier 1043 executes equalization processing and amplification of the electrical signal output from the low-noise amplification circuit 1042, and outputs the equalized and amplified electrical signal to the identification circuit 1044. The identification circuit 1044 performs identification and reproduction of the electrical signal output from the equalizer/amplifier 1043, and outputs the identified and reproduced signal (data) to the second device 1050. The second device 1050 executes processing based on the signal output from the receiver 1040.

(Simulation Result of Frequency Characteristics in the Amplification Circuit According to the Embodiment)

Figure 11:
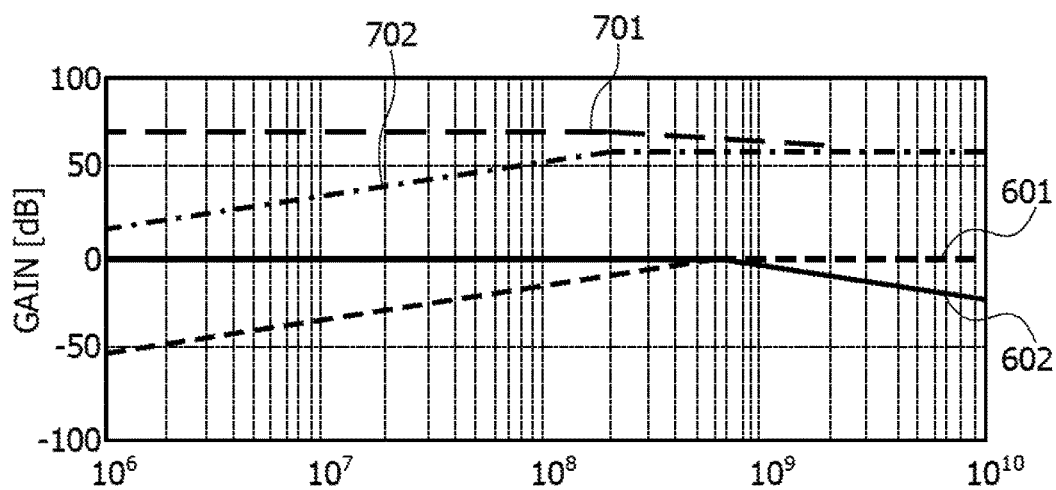
FIG. 11 is a graph illustrating a first example of a simulation result of frequency characteristics in the amplification circuit according to the embodiment.
Figure 12:
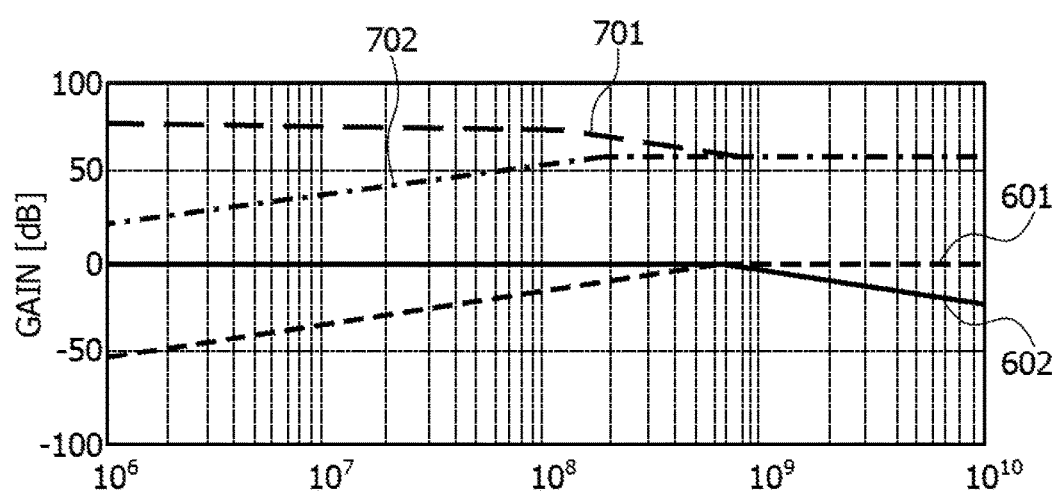
FIG. 12 is a graph illustrating a second example of a simulation result of frequency characteristics in the amplification circuit according to the embodiment.
Figure 13:
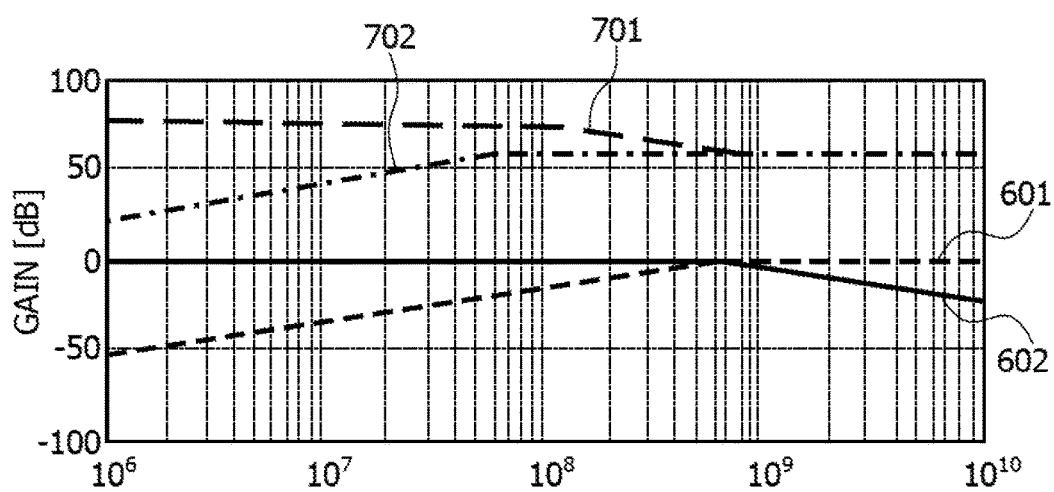
FIG. 13 is a graph illustrating a third example of a simulation result of frequency characteristics in the amplification circuit according to the embodiment.

FIGS. 11 to 13 are graphs each illustrating an example of a simulation result of frequency characteristics in the amplification circuit according to the embodiment. In FIGS. 11 to 13, a portion similar to the portion illustrated in FIG. 7 is assigned the same symbol, and the description thereof is omitted. FIGS. 11 to 13 respectively illustrate frequency characteristics 601, 602, 701, and 702 respectively in the state of A·β=0.7, A·β=0.8, and A·β=0.9.

As described above, the frequency characteristics 601 and 602 are respectively frequency characteristics of the HPF 101 and the LPF 113. The frequency characteristics 701 indicates a frequency characteristics of the amplification circuit 110. The frequency characteristics 702 indicates a frequency characteristics in the combination of the HPF 101 and the amplification circuit 110.

In addition, in the examples illustrated in FIGS. 11 to 13, the lower cut-off angular frequency ω_H of the frequency characteristics 601 of the HPF 101 and a higher cut-off angular frequency ω_L of the frequency characteristics 602 of the LPF 113 are both set to 628 Mrad/s.

As illustrated in the frequency characteristics 702 of FIG. 11, the lower cut-off angular frequency ω_Hall in the combination of the HPF 101 and the amplification circuit 110 when A·β=0.7 is 188 Mrad/s. As illustrated in the frequency characteristics 702 of FIG. 12, the lower cut-off angular frequency ω_Hall in the combination of the HPF 101 and the amplification circuit 110 when "A·β=0.8" is 126 Mrad/s. As illustrated in the frequency characteristics 702 of FIG. 13, the lower cut-off angular frequency ω_Hall in the combination of the HPF 101 and the amplification circuit 110 when "A·β=0.9" is 62.8 Mrad/s.

As illustrated in FIGS. 11 to 13, in the amplification circuit 110, the lower cut-off angular frequency ω_Hall in the combination of the HPF 101 and the amplification circuit 110 is enabled to be lower than the lower cut-off angular frequency ω_H in the HPF 101 alone (628 Mrad/s). For example, when A·β=0.9, the lower cut-off angular frequency ω_Hall in the combination of the HPF 101 and the amplification circuit 110 is 62.8 Mrad/s, 1/10 the lower cut-off angular frequency ω_H in the HPF 101 alone (628 Mrad/s).

The lower cut-off angular frequency ω_Hall in the combination of the HPF 101 and the amplification circuit 110 may be lowered even without increasing the capacitance of the capacitor of the HPF 101 (for AC coupling), as a result.

(Sag in an Output Signal in an Amplification Circuit)

Figure 14:
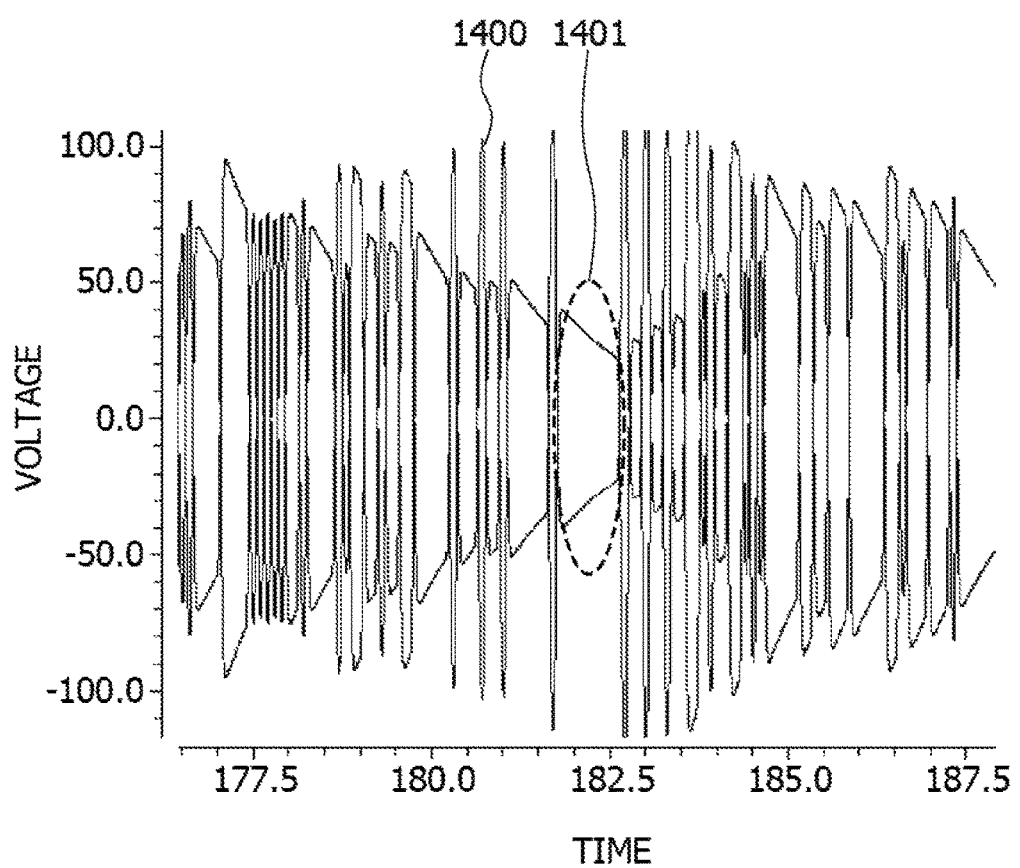
FIG. 14 is a reference diagram illustrating an example of a sag in an output signal of an amplification circuit.

FIG. 14 is a reference diagram illustrating an example of a sag in an output signal of an amplification circuit. In FIG. 14, the horizontal axis indicates time, and the vertical axis indicates voltage (V). An output waveform 1400 is, for example, a waveform of a signal output from an amplification circuit in which a lower cut-off angular frequency is high due to AC coupling. When signals in which a same symbol continues for an extended duration are input to the amplification circuit in which the lower cut-off angular frequency is high, a sag occurs due to signals of the same symbol continuing for a long time being cut off as a low frequency component (for example, a sag 1401). This may cause an error in identifying a value (0 or 1) of an electrical signal in a circuit at the later stage of the amplification circuit.

In contrast thereto, in the amplification circuit 110, as described above, the lower cut-off angular frequency ω_Hall may be set low, thereby enabling a sag to be suppressed. This thereby enables an error in identifying a value (0 or 1) of an electrical signal in a circuit at the later stage of the amplification circuit 110 to be suppressed.

(Eye Pattern of an Output Signal of an Amplification Circuit)

Figure 15:
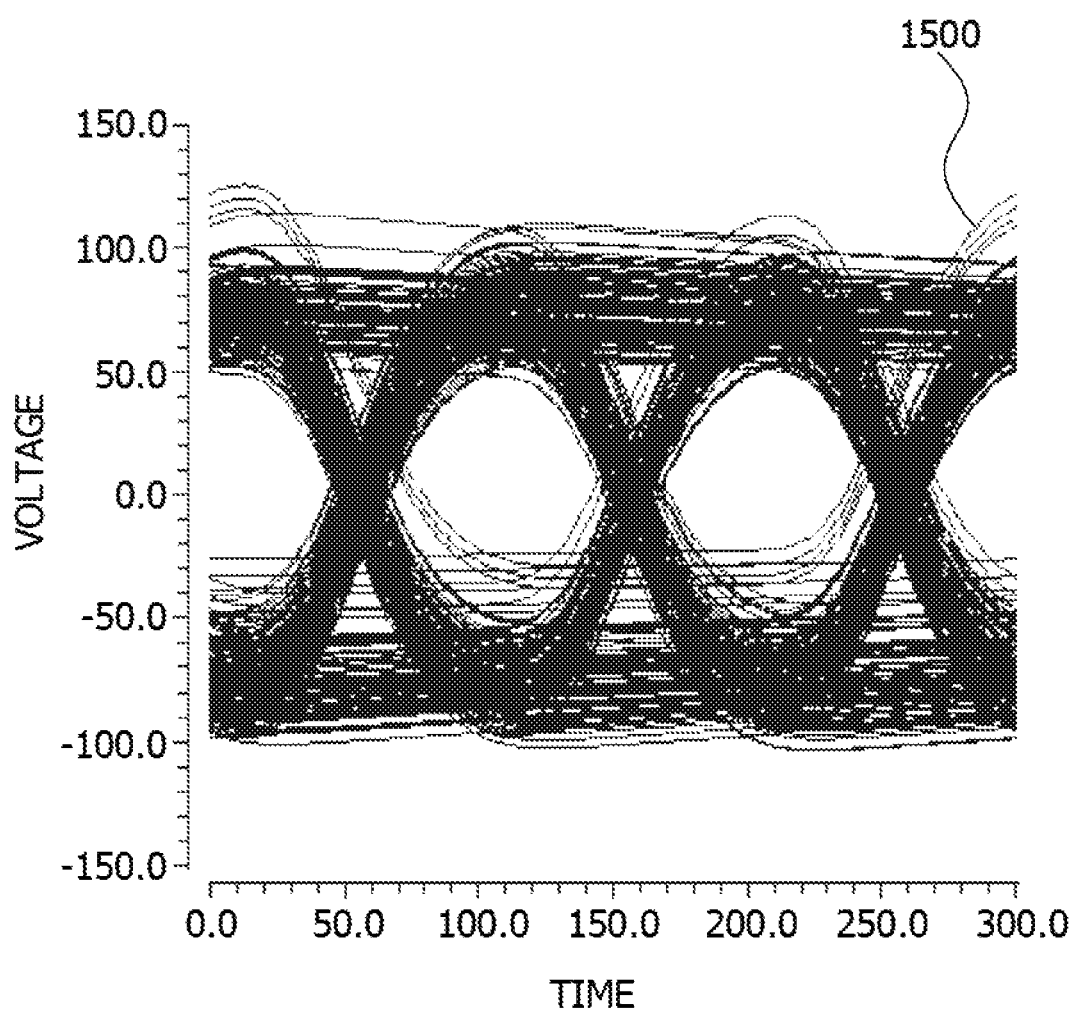
FIG. 15 is a reference diagram illustrating an example of an eye pattern of an output signal of an amplification circuit.

FIG. 15 is a reference diagram illustrating an example of an eye pattern of an output signal of an amplification circuit. In FIG. 15, the horizontal axis indicates time, and the vertical axis indicates voltage (V). An eye pattern 1500 is an eye pattern of a signal output from an amplification circuit in which a lower cut-off angular frequency is high. As illustrated in the eye pattern 1500, in the signal output from the amplification circuit in which the lower cut-off angular frequency is high, an eye opening is narrowed due to a sag.

(Eye Pattern of an Output Signal of the Amplification Circuit According to the Embodiment)

Figure 16:
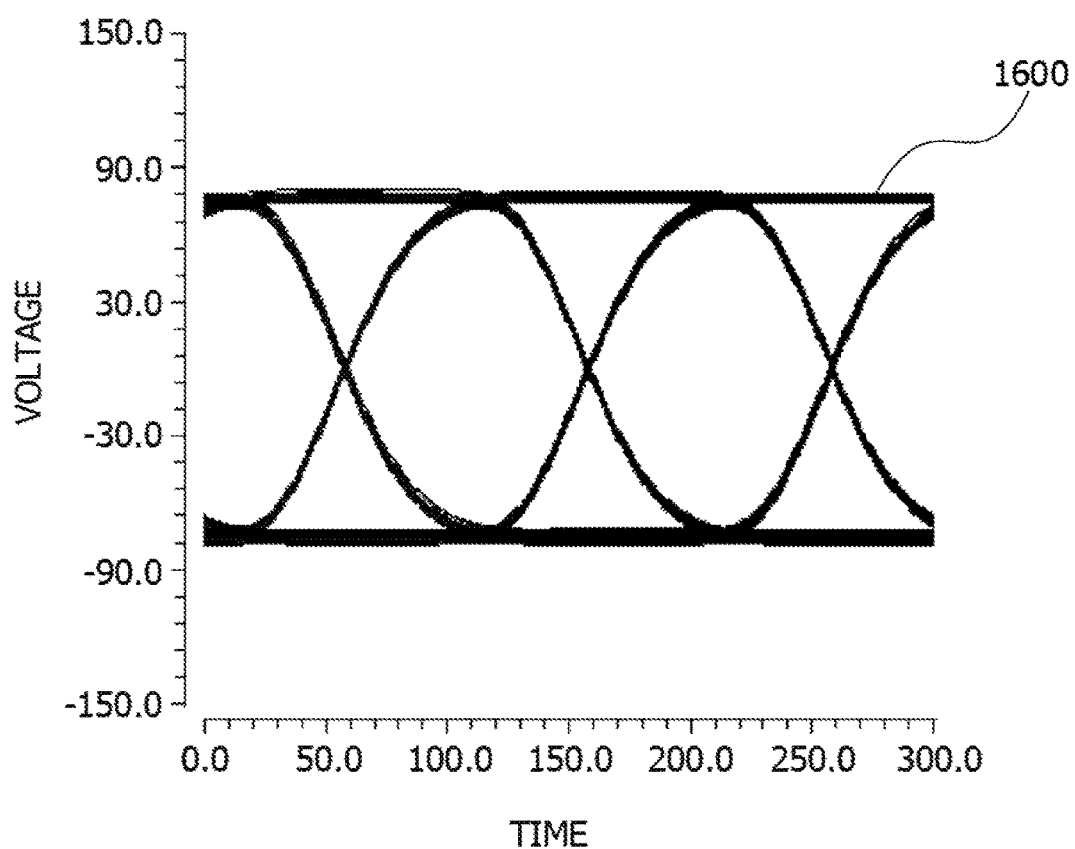
FIG. 16 is a diagram illustrating an example of an eye pattern of an output signal of the amplification circuit according to the embodiment.

FIG. 16 is a diagram illustrating an example of an eye pattern of an output signal of the amplification circuit according to the embodiment. In FIG. 16, the horizontal axis indicates time, and the vertical axis indicates voltage (V). An eye pattern 1600 is an eye pattern of a signal output from the amplification circuit 110 according to the embodiment. As illustrated in the eye pattern 1600, in the signal output from the amplification circuit 110, a sag is suppressed and therefore the eye opening is widened. The quality of the output signal is thus enabled to be improved in the amplification circuit 110.

(Another Example of the Amplification Circuit According to the Embodiment)

Figure 17:
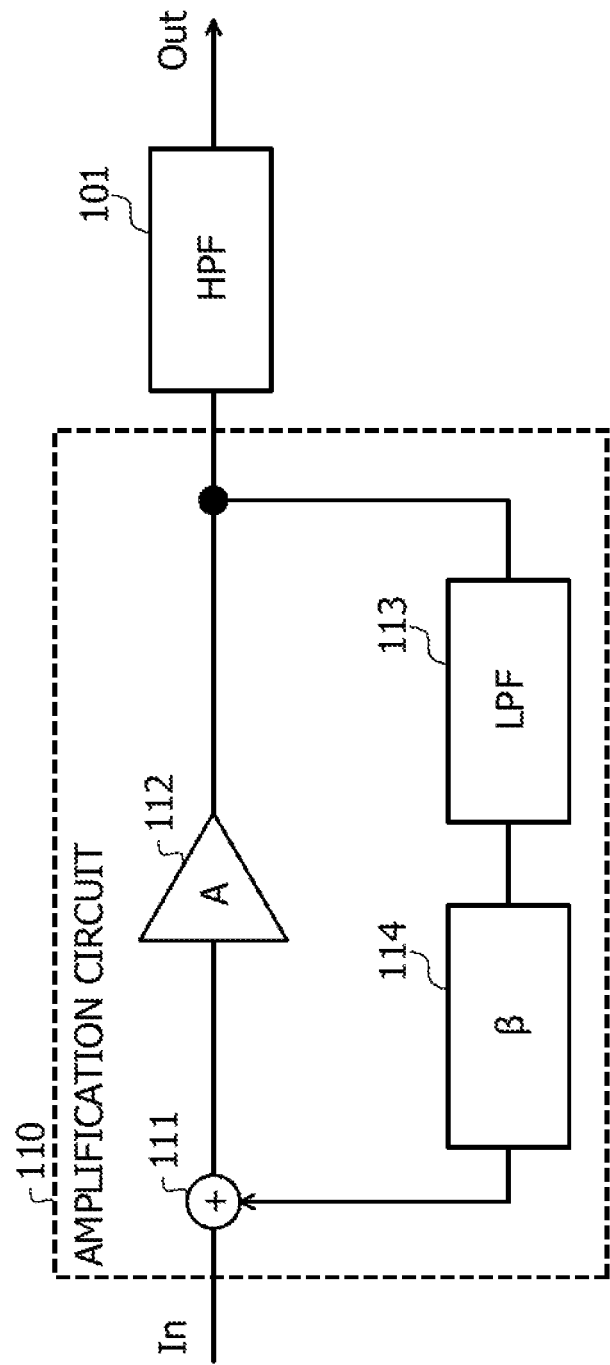
FIG. 17 is a diagram illustrating another example of the amplification circuit according to the embodiment.

FIG. 17 is a diagram illustrating another example of the amplification circuit according to the embodiment. In FIG. 17, a portion similar to the portion illustrated in FIG. 1 is assigned the same symbol, and the description thereof is omitted. As illustrated in FIG. 17, the amplification circuit 110 according to the embodiment may be configured such that the amplification circuit 110 is coupled to a circuit at the following stage by AC coupling. For example, a capacitor is placed between the circuit at the following stage of the amplification circuit 110 and the amplification circuit 110 in series. Therefore, as illustrated in FIG. 17, the HPF 101 is formed at the output of the amplification circuit 110 by AC coupling.

As illustrated in the above-described equation (4), for example, frequency characteristics in the combination of the HPF 101 and the amplification circuit 110 are the characteristics obtained by multiplying the frequency characteristics 601 of the HPF 101 by the frequency characteristics 701 of the amplification circuit 110. Thus, frequency characteristics in a combination of the HPF 101 and the amplification circuit 110 illustrated in FIG. 17 are the same as the frequency characteristics in the combination of the HPF 101 and the amplification circuit 110 illustrated in FIG. 1. Therefore, in the configuration illustrated in FIG. 17 too, similarly to the configuration illustrated in FIG. 1, the lower cut-off frequency may be lowered even without increasing the capacitance of a capacitor of the AC coupling.

For example, when the light emitting element drive circuit 1021 and the light emitting element 1022 illustrated in FIG. 10 are coupled to each other by AC coupling, the amplification circuit 110 illustrated in FIG. 17 may be applied to the light emitting element drive circuit 1021. A sag in an electrical signal output to the light emitting element 1022 may be suppressed as a result.

In this manner, the amplification circuit 110 according to the embodiment has a configuration in which the LPF 113 is provided so as to attenuate a high frequency component of a signal that is positively fed back to the input of the amplifier 112 by the feedback circuit 114 and the synthesis unit 111. The lower cut-off frequency in the combination of the HPF 101 and the amplification circuit 110 formed by AC coupling is thereby enabled to be lower than the lower cut-off frequency in the HPF 101.

Therefore, the lower cut-off frequency is enabled to be lowered even without increasing the capacitance of a capacitor of the AC coupling. Thus, while suppressing an increase in the size of the device, an occurrence of a sag due to attenuation of a low frequency component of a signal by the AC coupling is enabled to be suppressed.

In addition, the oscillation due to the positive feedback by the feedback circuit 114 and the synthesis unit 111 is enabled to be suppressed by setting a loop gain of the positive feedback by the feedback circuit 114 and the synthesis unit 111 to less than 1. This thereby enables an operation of the amplification circuit 110 to be stabilized.

Note that, in the above-described embodiment, the configuration is described in which the higher cut-off frequency of the LPF 113 is substantially the same as the lower cut-off frequency of the HPF 101, but the higher cut-off frequency of the LPF 113 is not limited to the same frequency as the lower cut-off frequency of the HPF 101.

Namely, the higher cut-off frequency of the LPF 113 may be set in a range in which the lower cut-off frequency in the combination of the HPF 101 and the amplification circuit 110 is lower than the lower cut-off frequency in the HPF 101. The lower cut-off frequency in the AC coupling configuration is thereby enabled to be lowered.

The configuration is described above in which the LPF 113 is provided at the stage before the feedback circuit 114, however a configuration may be applied in which the LPF 113 is provided at the stage following the feedback circuit 114, namely, a configuration may be applied in which the LPF 113 is provided between the feedback circuit 114 and the synthesis unit 111.

As described above, in the amplification circuit, the optical module, and the amplification method, the cut-off frequency may be lowered even without increasing the capacitance of a capacitor of the AC coupling.

For example, in an amplification circuit connected by AC coupling, a configuration is applied in which a LPF having a cut-off frequency equivalent to a lower cut-off frequency under the AC coupling and a feedback circuit are coupled in series, and a positive feedback is applied under a condition of loop gain<1 between the input and the output of the amplification circuit. This thereby enables the lower cut-off frequency to be lowered even without increasing the capacitance of a capacitor of the AC coupling.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplification circuit coupled to a first circuit by alternating current (AC) coupling comprising:
    an amplifier that amplifies an input signal by gain A and outputs the amplified input signal as a first signal to a second circuit;
    a loopback circuit that positively feeds back the first signal output from the amplifier to an input of the amplifier, the loopback circuit includes
        a low pass filter that attenuates a high frequency component of the first signal and outputs the attenuated first signal as a second signal, and
        a feedback circuit that attenuates the second signal output from the low pass filter by a feedback factor (gain) $\beta$ and positively feeds back to the input of the amplifier; and
    a high pass filter using AC coupling is formed at an input of the amplification circuit,
    a loop gain of the loopback circuit is represented as a product $A \cdot \beta$, and the loop gain is designed so as to satisfy $0 < A \cdot \beta < 1$, and
    the amplifier is a differential amplifier, and the feedback circuit includes
        a first feedback circuit that positively feeds back a normal output of the differential amplifier to an input of the differential amplifier, and
        a second feedback circuit that positively feeds back an inversion output of the differential amplifier to the input of the differential amplifier.

2. The amplification circuit according to claim 1, wherein a higher cut-off frequency in the low pass filter is equivalent to a lower cut-off frequency in the high pass filter.

3. The amplification circuit according to claim 1, wherein the amplifier includes a base grounded transistor amplification circuit that amplifies the input signal.

4. The amplification circuit according to claim 3, wherein the amplifier includes an emitter follower that outputs the signal amplified by the transistor amplification circuit.

5. The amplification circuit according to claim 1, wherein the feedback circuit includes an amplification unit that amplifies the signal output from the amplifier and a resistor through which the signal output from the amplifier is passed.

6. An optical module comprising:
    a light receiving element that outputs an electrical signal according to the power of received light;
    an amplifier that is coupled to the light receiving element by AC coupling and amplifies the electrical signal by gain A and outputs the amplified electrical signal as a first signal;
    a loopback circuit that positively feeds back the first signal output from the amplifier to an input of the amplifier, the loopback circuit includes
        a low pass filter that attenuates a high frequency component of the first signal and outputs the attenuated first signal as a second signal, and
        a feedback circuit that attenuates the second signal output from the low pass filter by a feedback factor (gain) $\beta$ and positively feeds back to the input of the amplifier; and
    a high pass filter using AC coupling is formed at the input of the amplifier,
    a loop gain of the loopback circuit is represented as a product $A \cdot \beta$, and the loop gain is designed so as to satisfy $0 < A \cdot \beta < 1$, and
    the amplifier is a differential amplifier, and the feedback circuit includes
        a first feedback circuit that positively feeds back a normal output of the differential amplifier to an input of the differential amplifier, and
        a second feedback circuit that positively feeds back an inversion output of the differential amplifier to the input of the differential amplifier.

7. An optical module comprising:
    a light emitting element that emits light according to an input electrical signal;
    an amplifier that is coupled to the light emitting element by AC coupling and amplifies the input electrical signal by gain A and outputs the amplified input electrical signal as a first signal;
    a loopback circuit that positively feeds back the first signal output from the amplifier to an input of the amplifier, the loopback circuit includes
        a low pass filter that attenuates a high frequency component of the first signal and outputs the attenuated first signal as a second signal, and
        a feedback circuit that attenuates the second signal output from the low pass filter by a feedback factor (gain) $\beta$ and positively feeds back to the input of the amplifier; and
    a high pass filter using AC coupling is formed at the input of the amplifier, a loop gain of the loopback circuit is represented as a product A·β, and the loop gain is designed so as to satisfy 0<A·β<1, and the amplifier is a differential amplifier, and the feedback circuit includes
- a first feedback circuit that positively feeds back a normal output of the differential amplifier to an input of the differential amplifier, and
- a second feedback circuit that positively feeds back an inversion output of the differential amplifier to the input of the differential amplifier.

8. An amplification method by an amplification circuit that is coupled to a first circuit by AC coupling and includes an amplifier, a low pass filter and a feedback circuit, the amplification method comprising:

amplifying an input signal of the amplifier by gain A and outputting the amplified input signal as a first signal;

attenuating a high frequency component of the first signal and outputting the attenuated first signal as a second signal; and attenuating the second signal by a feedback factor (gain) β and positively feeding back the attenuated second signal to an input of the amplifier, a high pass filter using AC coupling is formed at an input of the amplification circuit, and the low pass filter and the feedback circuit constitute a loopback circuit, a loop gain of the loopback circuit is represented as a product A·β, and the loop gain is designed so as to satisfy 0<A·β<1, and the amplifier is a differential amplifier, and the feedback circuit includes
- a first feedback circuit that positively feeds back a normal output of the differential amplifier to an input of the differential amplifier, and
- a second feedback circuit that positively feeds back an inversion output of the differential amplifier to the input of the differential amplifier.

* * * * *